United States Patent
Smith

(10) Patent No.: US 7,231,010 B2
(45) Date of Patent: Jun. 12, 2007

(54) DIGITAL FREQUENCY SYNTHESIZER BASED PLL

(75) Inventor: Sterling Smith, Hsinchu (TW)

(73) Assignee: MStar Semiconductor, Inc. (TW)

( * ) Notice: Subject to any disclaimer, the term of this patent is extended or adjusted under 35 U.S.C. 154(b) by 761 days.

(21) Appl. No.: 10/619,488

(22) Filed: Jul. 16, 2003

(65) Prior Publication Data

US 2004/0052324 A1    Mar. 18, 2004

Related U.S. Application Data

(60) Provisional application No. 60/396,900, filed on Jul. 18, 2002.

(51) Int. Cl.
*H03D 3/24* (2006.01)

(52) U.S. Cl. .................................. 375/376

(58) Field of Classification Search ............. 375/245, 375/247, 371, 375–376; 341/143; 332/127; 327/156
See application file for complete search history.

(56) References Cited

U.S. PATENT DOCUMENTS 5,825,253 A * 10/1998 Mathe et al. ............... 331/18
6,515,553 B1 * 2/2003 Filiol et al. ................ 332/127
6,700,446 B2 * 3/2004 Ke ............................. 331/1 A
6,927,716 B2 * 8/2005 Keaveney et al. .......... 341/143
6,961,400 B1 * 11/2005 Huff et al. .................. 375/376

* cited by examiner

*Primary Examiner*—Khanh Tran
(74) *Attorney, Agent, or Firm*—Michael Bednarek; Paul, Hastings, Janofsky & Walker LLP

(57) ABSTRACT

The present invention provides a phase-locked loop that comprises a divider, a noise-shaped quantizer, a filter, a phase detector and digital loop filter. The divider is used for receiving a reference clock with a substantially fixed period and generating an output clock with a time-varying period. The noise-shaped quantizer is used for quantizing a period control word to a time-varying value in response to the output clock fed from the divider so that the divider generates the output clock by means of dividing the reference clock by the time-varying value. The filter is employed to substantially filter out jitter from the output clock. The phase detector is used for generating a phase error in response to the filtered output clock and an input signal. The digital loop filter is used for generating the period control word in response to the phase error.

12 Claims, 2 Drawing Sheets

DIGITAL FREQUENCY SYNTHESIZER BASED PLL

CROSS-REFERENCE TO RELATED APPLICATION

The present application claims the priority benefits of U.S. provisional application entitled "DIGITAL FREQUENCY SYNTHESIZER BASED PLL" filed on Jul. 18, 2002 Ser. No. 60/396,900. All disclosures of this application are incorporated herein by reference.

BACKGROUND OF THE INVENTION

1. Field of the Invention

The present invention generally relates to a phase-locked loop (PLL). More particular, the present invention relates to a phase-locked loop with a digital frequency synthesizer featuring very accurate long-term phase and jitter stability 2. Description of Related Arts In modern display system, a high speed (20–300 MHz) and low phase-drift clock is provided by a phase-locked loop (PLL) to digitize the graphics RGB signals while only an imprecise, very low frequency reference signal HSYNC of about 30–100 KHz is supplied to the system. The conventional PLL utilizes a frequency synthesizer configured with a delta-sigma fractional divider in PLL feedback loop and operates on N, N+1 basis, and usually the PLL input is directly from crystal such as 14 MHz or 20 MHz. This results in jitter at much lower offset frequencies that requires larger area to suppress.

SUMMARY OF THE INVENTION

It is therefore an objective of the present invention to provide a digital frequency synthesizer based PLL featuring very accurate long-term phase and jitter stability.

To attain this objective, the present invention provides a phase-locked loop that comprises a divider, a noise-shaped quantizer, a filter, a phase detector and digital loop filter. The divider is used for receiving a reference clock with a substantially fixed period and generating an output clock with a time-varying period. The noise-shaped quantizer is used for quantizing a period control word to a time-varying value in response to the output clock fed from the divider so that the divider generates the output clock by means of dividing the reference clock by the time-varying value. The filter is employed to substantially filter out jitter from the output clock. The phase detector is used for generating a phase error in response to the filtered output clock and an input signal. The digital loop filter is used for generating the period control word in response to the phase error.

Moreover, the present invention provides a phase-locked loop that comprises a first divider, a noise-shaped quantizer, a filter, a second divider, a phase detector and a digital loop filter. The first divider is used for receiving a reference clock with a substantially fixed period and generating an output clock with a time-varying period. The noise-shaped quantizer is used for quantizing a period control word to a time-varying value in response to the output clock fed from the first divider so that the first divider generates the output clock by means of dividing the reference clock by the time-varying value. The filter is employed to substantially filter out jitter from the output clock. The second divider is used for dividing the filtered output clock by the period control word so as to generate one divided output clock. The phase detector is used for generating a phase error in response to the divided output clock and an input signal. The digital loop filter for generating the period control word in response to the phase error.

DETAILED DESCRIPTION OF THE PREFERRED EMBODIMENTS

In the following detailed description of the preferred embodiments, reference is made to the accompanying drawings that form a part hereof, and in which is shown by way of illustration specific preferred embodiments in which the invention may be practiced. The preferred embodiments are described in sufficient detail to enable these skilled in the art to practice the invention, and it is to be understood that other embodiments may be utilized and that logical changes may be made without departing from the spirit and scope of the present invention. The following detailed description is, therefore, not to be taken in a limiting sense, and the scope of the present invention is defined only by the appended claims.

Figure 1:
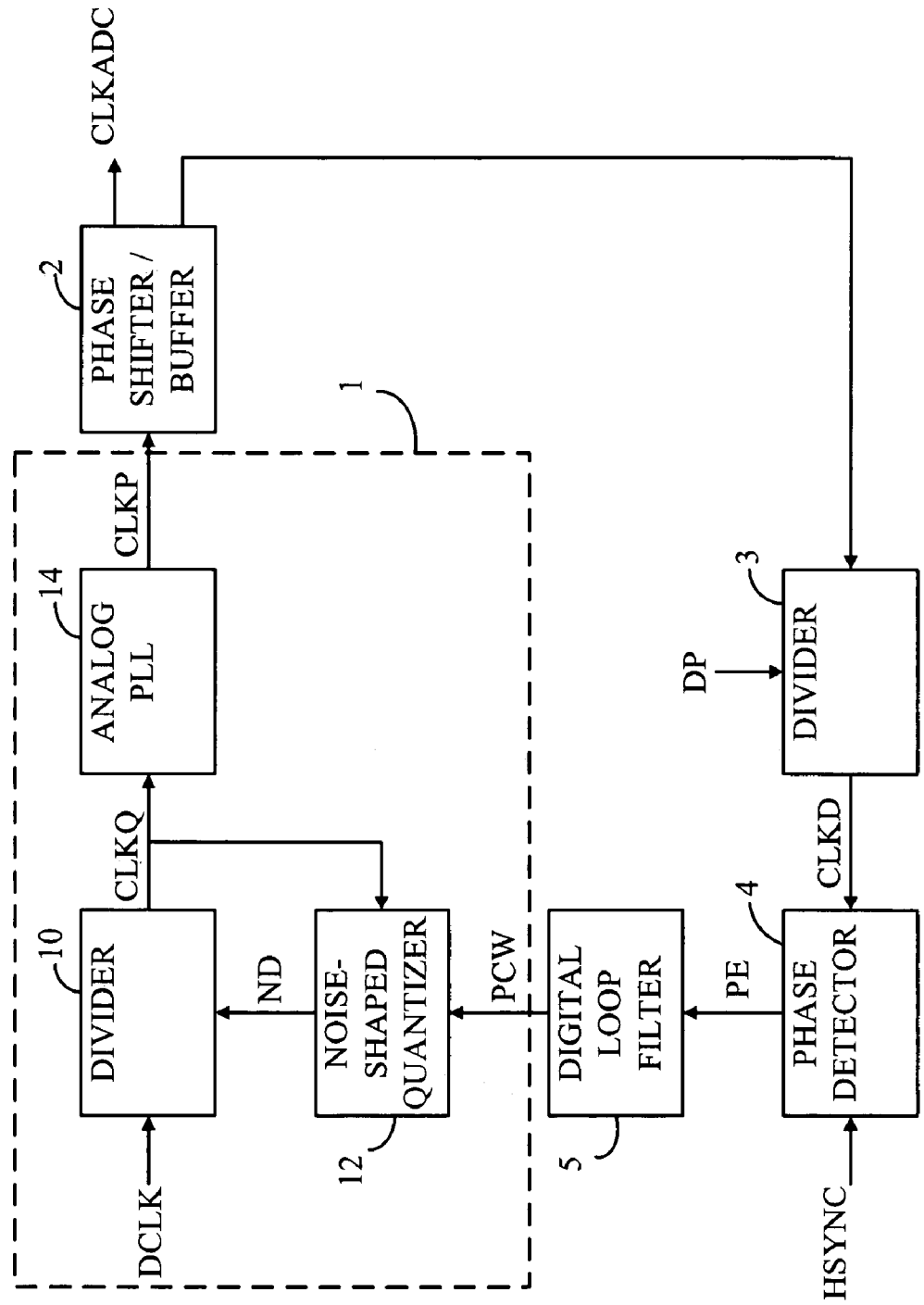
FIG. 1 schematically illustrates a block diagram of a digital frequency synthesizer based PLL in accordance with one preferred embodiment of the present invention.

Referring to FIG. 1, a block diagram of a digital frequency synthesizer based PLL in accordance with one preferred embodiment of the present invention is schematically illustrated. In FIG. 1, the digital frequency synthesizer based PLL of the present invention comprises a digital frequency synthesizer 1, a phase shifter/buffer 2, a divider 3, a phase detector 4 and a digital loop filter 5 connected in a loop. A high speed very stable digital clock DCLK, normally based on a crystal oscillator reference, is employed as a stable reference baseline period and supplied to the digital frequency synthesizer 1. The reference clock DCLK provided with a higher frequency will give the preferable results. For example, in the application of flat panel display controllers, 200 MHz or above can be provided for the reference clock DCLK.

As shown in FIG. 1, the digital frequency synthesizer 1 comprises a divider 10, a noise-shaped quantizer 12, an analog phase locked loop (PLL) 14. The reference clock DCLK is received and divided by a time-varying value ND(t) in the divider 10 so as to generate an output clock CLKQ having a time-varying period TD(t). Although the output clock CLKQ has the time-varying period TD(t), the time-varying algorithm will be arranged to give the output clock CLKQ a very precise average period such that precise average output clock frequency can be obtained. As shown in FIG. 1, the output clock CLKQ is fed back to the noise-shaped quantizer 12 that receives a period control word PCW from the digital loop filter 5. The noise-shaped quantizer 12 is employed to quantize the period control word PCW to the time-varying value ND(t) in response to the feedback output clock CLKQ. According to the present invention, the noise-shaped quantizer 12 can be a delta-sigma quantizer so that the time-varying value ND(t) is spectrally shaped by the noise-shaped quantizer 12 using a digital delta-sigma algorithm. Preferably, the period control word PCW is configured with a bit resolution greater than that of the time-varying value ND(t). In this preferred embodiment, the period control word is a precise word of 24-bit resolution which is quantized into a low precision value ND(t) of 5-bit resolution.

As mentioned above, the noise-shaped quantizer 12 of the present invention converts the high resolution input, that is, the period control word PCW, to the low resolution output ND(t) in such a way as to spectrally shape the quantization error, most of which is at very high frequency range. Noted that the quantization error is directed to the difference between the period control word and time-varying integer value ND(t). With delta-sigma quantization, the spectral density of the quantization error in ND(t) or TD(t) is very low at low frequencies and rises with increasing frequency. In some systems no further processing need be done to the output clock CLKQ if cycle-cycle jitter is not critical. In other systems, the output clock CLKQ may not be useful as a low jitter output clock due to the large amount of jitter from the time-varying nature of the period TD(t). To reduce the jitter, the output clock CLKQ may be input to the analog PLL 14 that can filter the jitter to produce a stable output clock CLKP. If the spectral properties of the time-varying period TD(t) are properly designed, the amount of jitter reduction from the analog PLL 14 can be very significant. In other words, the output clock CLKQ can be filtered by using the analog PLL 14 to suppress the high frequency jitter if the cycle-cycle jitter is a design concern. Thus, the analog PLL 14 serves as a filter means for effectively filtering the jitter from the output clock CLKQ.

Moreover, the divider 10 can take any value between minimum and maximum given by the noise-shaped quantizer 12. Thus, using the time-varying divider 10 to divide down the high frequency fixed-period clock reference clock DCLK to synthesize a precise long-term average frequency output clock CLKQ directly in digital domain. Therefore, the average period of the output clock CLKQ or the filtered output clock CLKP is kept very precise.

Referring to FIG. 1, the clock signal CLKP is transmitted to the divider 3 through the buffer 2 so that the frequency of the clock signal CLKP is divided by a divisor DP to generate a divided clock signal CLKD. The divisor DP is determined according to total pixel number for each scan line in application of the display system. The phase detector 4 is used to detect a phase difference between the a horizontal synchronization signal HSYNC and the clock signal CLKD and generate a phase error PE accordingly. The phase error PE is subsequently supplied to the digital loop filter 5 and converted into the period control word PCW. Therefore, the digital frequency synthesizer 1 can generate the clock signal CLKP based upon the updated period control word PCW. The clock signal CLKP with accurate long-term phase and jitter stability can be adjusted by means of the phase shifter 2 to generate an output clock signal CLKADC as a clock input to a high-speed analog-to-digital converter (ADC). The ADC is used to sample the graphics RGB signals in response to the clock signal CLKADC.

Figure 2:
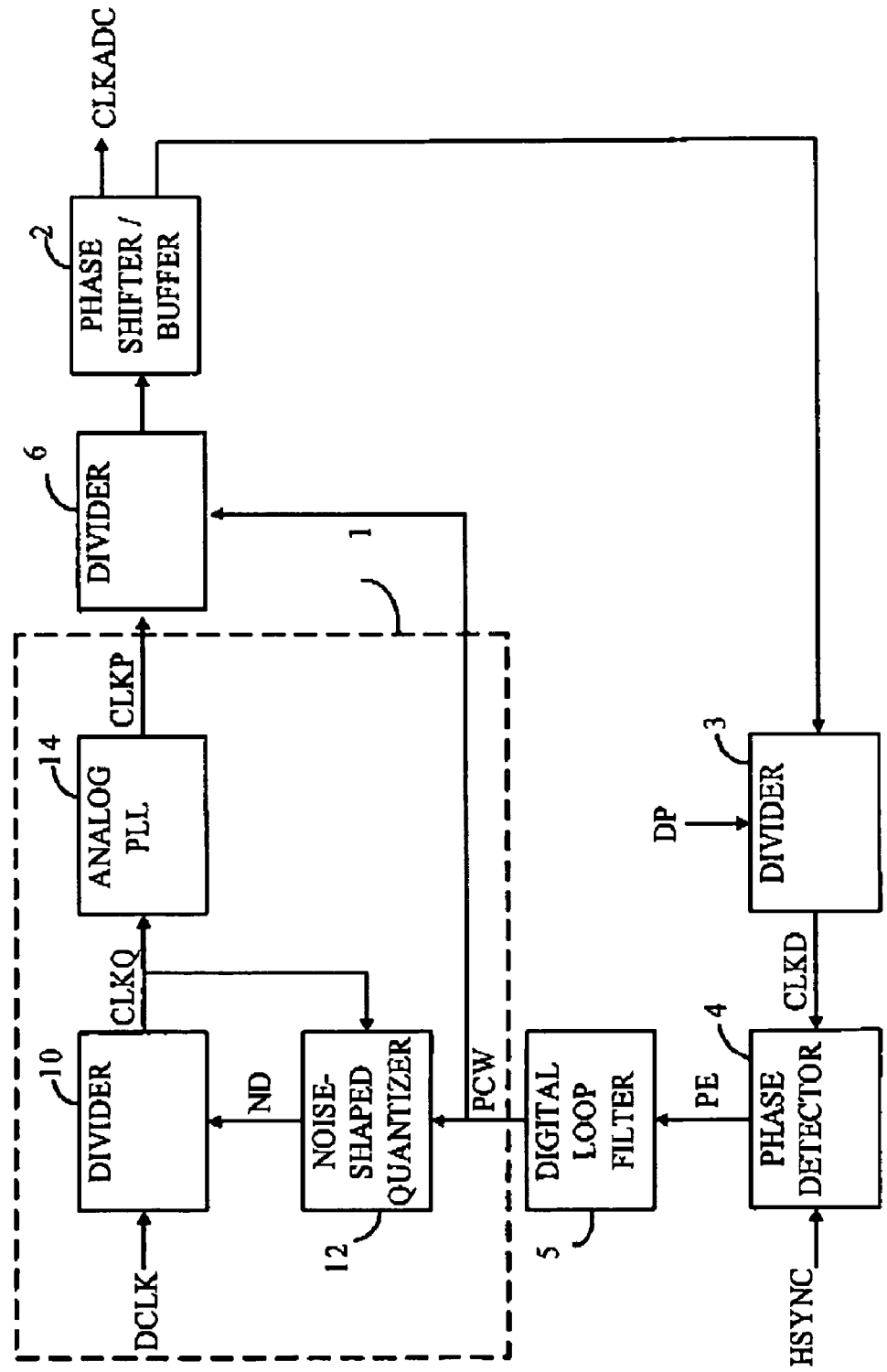
FIG. 2 schematically illustrates a block diagram of a digital frequency synthesizer based PLL in accordance with another preferred embodiment of the present invention.

Referring to FIG. 2, a block diagram of a digital frequency synthesizer based PLL in accordance with another preferred embodiment of the present invention is schematically illustrated. In FIG. 2, another divider 6 is used to receive the clock signal CLKP and divide down the frequency of the clock signal CLKP by the period control word PCW.

The digital frequency synthesizer base PLL, in accordance with the present invention, uses the time-varying divider 10 to divide down the high frequency fixed-period clock reference clock DCLK to synthesize the precise long-term average frequency output clock CLKQ directly in digital domain. Therefore, no look-up table, digital-to-analog converter, phase locked loop or delay locked loop is required for the divider 10. Also, no conventional approach of N, N+1 divider is required for the frequency synthesizer of the present invention.

Moreover, the digital frequency synthesizer base PLL of the present invention uses the delta-sigma algorithm to quantize the precise period control word to the low precision time-varying integer value ND(t). Such a way forces most of the jitter of the reference clock DCLK to be at high frequency by making the divider value ND(t) be selected from a set of small integer values. In addition, higher frequency jitter decreases the cost of the subsequent jitter low-pass filtering block when required. If the frequency of the reference clock DCLK is chosen properly, the required integer values can be less than 60 for the time-varying value ND(t).

Furthermore, the digital frequency synthesizer base PLL of the present invention uses the very precise digital input, that is, the high resolution period control word, to the noise-shaped quantizer 12 to ensure that the average period of the output clocks CLKQ and, subsequently, CLKP are kept very precise.

In addition, CLKP or a clock derived from CLKP is used as a clock input to a high-speed ADC so as to precisely digitize video graphics signals in display system.

Although the description above contains much specificity, it should not be construed as limiting the scope of the invention but as merely providing illustrations of some of the presently preferred embodiments of the present invention. Thus, the scope of the present invention should be determined by the appended claims and their equivalents, rather than by the examples given.

What is claimed is:

1. A phase-locked loop, comprising:
   a divider for receiving a reference clock with a substantially fixed period and generating an output clock with a time-varying period;
   a noise-shaped quantizer for quantizing a period control word to a time-varying value in response to said output clock fed from said divider so that said divider generates said output clock by means of dividing said reference clock by said time-varying value;
   a filter for substantially filtering out jitter from said output clock;
   a phase detector for generating a phase error in response to said filtered output clock and an input signal; and
   a digital loop filter for generating said period control word in response to said phase error.

2. The phase-locked loop as claimed in claim 1, wherein said period control word has a bit resolution greater than that of said time-varying value.

3. The phase-locked loop as claimed in claim 1, wherein said noise-shaped quantizer is a delta-sigma quantizer.

4. The phase-locked loop as claimed in claim 1, wherein said filter is an analog phase locked loop (PLL) device as a low pass filter for removing high frequency jitter from said output clock.

5. The phase-locked loop as claimed in claim 1, further comprising a phase shifter for shifting a phase of said filtered output clock.

6. The phase-locked loop as claimed in claim 1, further comprising another divider for dividing said filtered output clock by a divisor such that said phase detector generates said phase error in response to said divided output clock and said input signal.

7. A phase-locked loop, comprising:
   a first divider for receiving a reference clock with a substantially fixed period and generating an output clock with a time-varying period;

a noise-shaped quantizer for quantizing a period control word to a time-varying value in response to said output clock fed from said first divider so that said first divider generates said output clock by means of dividing said reference clock by said time-varying value;

a filter for substantially filtering out jitter from said output clock;

a second divider for dividing said filtered output clock by said period control word so as to generate one divided output clock;

a phase detector for generating a phase error in response to said divided output clock and an input signal; and a digital loop filter for generating said period control word in response to said phase error.

8. The phase-locked loop as claimed in claim 7, wherein said period control word has a bit resolution greater than that of said time-varying value.

9. The phase-locked loop as claimed in claim 7, wherein said noise-shaped quantizer is a delta-sigma quantizer.

10. The phase-locked loop as claimed in claim 7, wherein said filter is an analog phase locked loop (PLL) device as a low pass filter for removing high frequency jitter from said output clock.

11. The phase-locked loop as claimed in claim 7, further comprising a phase shifter for shifting a phase of said filtered output clock.

12. The phase-locked loop as claimed in claim 7, further comprising a third divider for dividing said one divided output clock by a divisor to another divided output clock such that said phase detector generates said phase error in response to said another divided output clock and said input signal.

* * * * *